United States Patent
Kato

(10) Patent No.: US 9,972,588 B2
(45) Date of Patent: May 15, 2018

(54) SEMICONDUCTOR DEVICE

(71) Applicant: Mitsubishi Electric Corporation, Tokyo (JP)

(72) Inventor: Katsuya Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/453,471

(22) Filed: Mar. 8, 2017

(65) Prior Publication Data
US 2018/0090456 A1 Mar. 29, 2018

(30) Foreign Application Priority Data

Sep. 27, 2016 (JP) .................. 2016-188202

(51) Int. Cl.
| | |
|---|---|
| H01L 29/40 | (2006.01) |
| H01L 23/66 | (2006.01) |
| H01P 3/08 | (2006.01) |
| H01L 23/498 | (2006.01) |
| H01L 29/06 | (2006.01) |
| H01L 23/00 | (2006.01) |
| H01L 23/48 | (2006.01) |
| H03H 7/38 | (2006.01) |

(52) U.S. Cl.
CPC .......... *H01L 23/66* (2013.01); *H01L 23/481* (2013.01); *H01L 23/49833* (2013.01); *H01L 23/49838* (2013.01); *H01L 24/06* (2013.01); *H01L 24/49* (2013.01); *H01L 29/0696* (2013.01); *H01P 3/081* (2013.01); *H03H 7/38* (2013.01); *H01L 2223/6611* (2013.01); *H01L 2223/6627* (2013.01); *H01L 2224/04042* (2013.01); *H01L 2224/48091* (2013.01); *H01L 2224/48101* (2013.01); *H01L 2224/48106* (2013.01); *H01L 2224/48155* (2013.01); *H01L 2224/48175* (2013.01); *H01L 2924/1306* (2013.01); *H01L 2924/19032* (2013.01); *H01L 2924/19041* (2013.01); *H01L 2924/19107* (2013.01)

(58) Field of Classification Search
CPC ......... H01L 23/66; H01L 24/48; H01L 24/49; H01L 23/642; H01L 23/49838; H01L 23/49833; H01L 23/481; H01L 24/06
USPC ....................................................... 257/664
See application file for complete search history.

(56) References Cited

U.S. PATENT DOCUMENTS

| | | | |
|---|---|---|---|
| 2010/0140721 A1 | 6/2010 | Takagi | |
| 2012/0274406 A1* | 11/2012 | Kobayashi | .............. H03F 1/223 330/310 |

FOREIGN PATENT DOCUMENTS

| | | |
|---|---|---|
| JP | H11-238851 A | 8/1999 |
| JP | 2008-022235 A | 1/2008 |
| JP | 2010-161348 A | 7/2010 |

* cited by examiner

*Primary Examiner* — Theresa T Doan
(74) *Attorney, Agent, or Firm* — Studebaker & Brackett PC

(57) ABSTRACT

In a circuit substrate, a plurality of first microstrip lines connect outputs of a plurality of circuit patterns containing a parallel capacitor to a plurality of first output pads respectively. A plurality of second wires connect the first output pads of the circuit substrate to inputs of a plurality of transistor cells of a semiconductor substrate respectively. The numbers of the fingers of the transistor cells are the same. The first microstrip lines connected to the circuit patterns disposed on both sides of the lining-up circuit patterns are longer than the other first microstrip lines.

8 Claims, 8 Drawing Sheets

SEMICONDUCTOR DEVICE

BACKGROUND OF THE INVENTION

Field

The present invention relates to a semiconductor device capable of suppressing deterioration in characteristics and oscillation due to uneven operations of the transistor cells.

Background

In power amplifiers used for wireless communication and the like, bonding wires are widely used in order to connect an FET chip to a matching circuit substrate. In general, matching circuits composed of microstrip lines are disposed on the matching circuit substrate, and a plurality of bonding wires are connected in parallel as short as possible in order to secure a large current capacity.

The lengths of the microstrip lines required for impedance matching are large in the case of a relatively low frequency as in the L-band or the S-band. This leads to a large-sized power amplifier and increased costs. Accordingly, a circuit composed of lumped elements is often used. In particular, impedance transforming using bonding wires' inductance components can realize a small-sized circuit and low costs.

When bonding wires are disposed in parallel and close to one another, mutual inductances between the bonding wires cannot be ignored. It is further known that the mutual inductances are smaller for the bonding wires closer to both sides thereof. The inductance of a wire is given as the sum of a self-inductance and a mutual inductance. The self-inductance becomes larger as the length of the wire becomes larger. The difference between the mutual inductances generates a difference between load impedances possibly depending on the positions of the FETs when making all the lengths of the bonding wires the same, the bonding wires connecting the FET chip to the matching circuit substrate. The difference between the load impedances causes operation out of balance, which results in deterioration of the saturated output power, the gain and the efficiency, and in addition, oscillation.

To deal with such problems, methods are proposed in which the inductances of the bonding wires are adjusted by changing the lengths, heights, numbers and thicknesses of the bonding wires (for example, see JP 2010-161348 A and JP 11-238851 A). Moreover, it is reported that also in a matching circuit in which $\lambda/4$ lines are disposed in a tournament tree, the aforementioned difference between the mutual inductances arises between the adjacent $\lambda/4$ lines. To deal with this problem, methods are proposed in which the lengths of the lines are adjusted (for example, see JP 2010-161348 A and JP 2008-022235 A).

The conventional methods of changing the lengths of the bonding wires need the bonding wires on both sides to be longer or higher in order to supplement the small inductances of the bonding wire on both sides. High-looped bonding wires generally cause large deviation. Meanwhile, change in number or thicknesses of the bonding wires discretely changes the inductances, which makes optimization of those difficult.

The input impedance of a transistor used for a microwave power amplifier is generally lower than 50Ω, so the characteristic impedance of a $\lambda/4$ line provided for impedance transforming is also configured to be lower than 50Ω. Nevertheless, such a low characteristic impedance of the line cannot lead to sufficient improvement of the difference in mutual impedance between the wires. Accordingly, although the conventional method of adjusting the length of the $\lambda/4$ line can improve unevenness in phases, it is insufficient for suppression of uneven operations of the FETs since it cannot improve unevenness in reflection coefficients.

SUMMARY

The present invention is devised in view of the aforementioned problems, and an object thereof is to provide a semiconductor device in which load impedances of transistor cells are made even without change in shapes of bonding wires. Such a semiconductor device, thereby, can suppress deviation among the bonding wires and suppress deterioration in characteristics and oscillation due to uneven operations of the transistor cells.

According to the present invention, a semiconductor device includes: an input terminal; a circuit substrate including a plurality of circuit patterns containing a parallel capacitor, a plurality of first input pads connected to inputs of the circuit patterns respectively; a plurality of first output pads, and a plurality of first microstrip lines connecting outputs of the circuit patterns to the first output pads respectively; a semiconductor substrate including a plurality of transistor cells, a plurality of second input pads connected to inputs of the transistor cells, and a plurality of second output pads connected to outputs of the transistor cells; an output terminal; a plurality of first wires connecting the input terminal to the first input pads respectively; a plurality of second wires connecting the first output pads to the second input pads respectively; and a plurality of third wires connecting the second output pads to the output terminal respectively, wherein each of the transistor cells has a plurality of fingers connected in parallel and a source electrode connected to a rear electrode through a via hole, the numbers of the fingers of the transistor cells are the same, and the first microstrip lines connected to the circuit patterns disposed on both sides of the lining-up circuit patterns are longer than the other first microstrip lines.

In the present invention, the first microstrip lines connected to the circuit patterns disposed on both sides of the lining-up circuit patterns are longer than the other first microstrip lines. Thereby, the load impedances of the transistor cells can be made even without change in shapes of the bonding wires, which can suppress deviation of the bonding wires and suppress deterioration in characteristics and oscillation due to uneven operations of the transistor cells.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
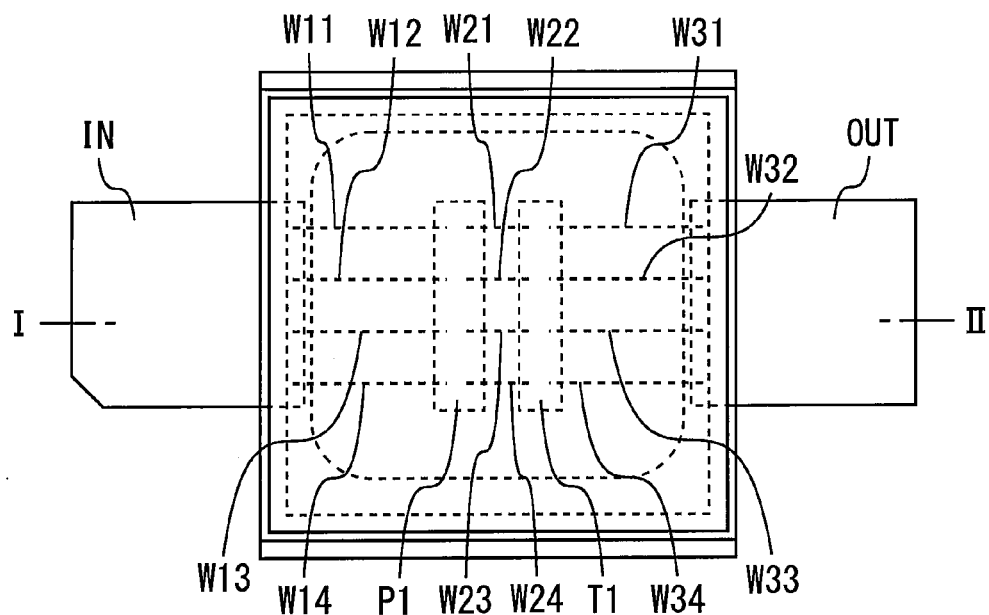
FIG. 1 is a plan view showing a semiconductor device according to a first embodiment of the present invention.
Figure 2:
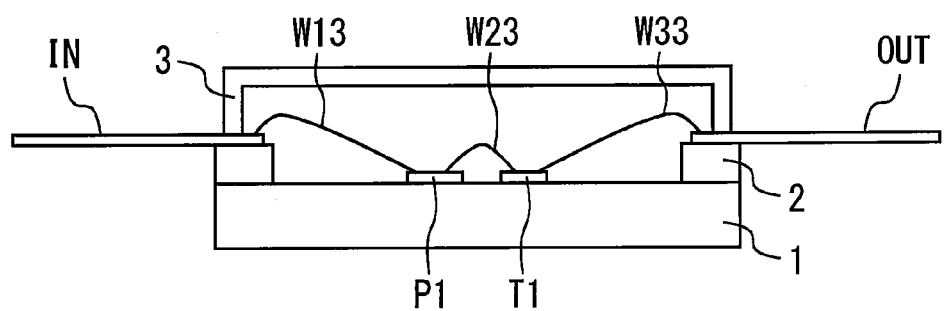
FIG. 2 is a cross-sectional view taken along the I-II line in FIG. 1.

FIG. 1 is a plan view showing a semiconductor device according to a first embodiment of the present invention. FIG. 2 is a cross-sectional view taken along the I-II line in FIG. 1. On a base 1 which is a metal portion in a package, a circuit substrate P1 having prematching circuits, and a semiconductor substrate T1 having field effect transistors of GaN or the like are provided. On the base 1, the circuit substrate P1 and the semiconductor substrate T1 are enclosed by a sidewall 2 of the package. An input terminal IN and an output terminal OUT are provided on two opposite sides of the sidewall 2. Wires W11 to W14 connect the input terminal IN to the circuit substrate P1. Wires W21 to W24 connect the circuit substrate P1 to the semiconductor substrate T1. Wire W31 to W34 connect the semiconductor substrate T1 to the output terminal OUT. The inside of the sidewall 2 is covered by a lid 3.

Figure 3:
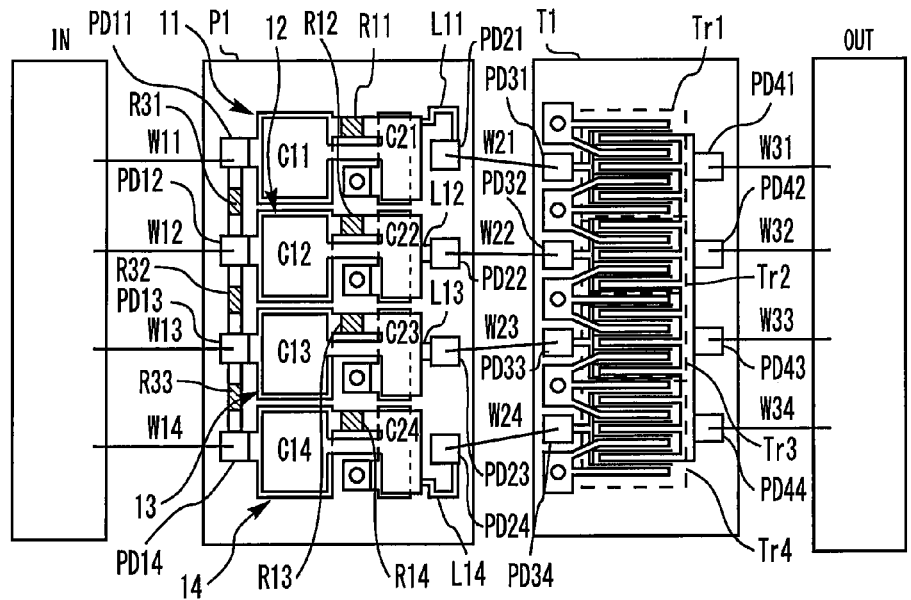
FIG. 3 is a plan view showing the inside of the semiconductor device according to the first embodiment of the present invention.
Figure 4:
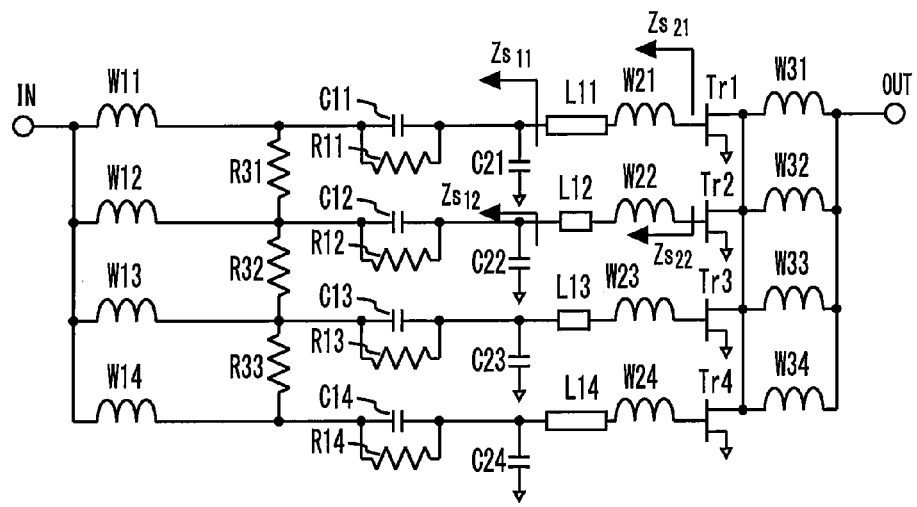
FIG. 4 is a diagram showing an equivalent circuit of the semiconductor device according to the first embodiment of the present invention.

FIG. 3 is a plan view showing the inside of the semiconductor device according to the first embodiment of the present invention. FIG. 4 is a diagram showing an equivalent circuit of the semiconductor device according to the first embodiment of the present invention. Circuit patterns 11 to 14 are provided in the circuit substrate P1. The circuit patterns 11 to 14 have series capacitors C11 to C14, parallel capacitors C21 to C24, and resistors R11 to R14 connected to the series capacitors C11 to C14 in parallel, respectively. The series capacitors C11 to C14 and the resistors R11 to R14 constitute a stabilizer circuit. The parallel capacitors C21 to C24 are a part of an impedance matching circuit. The series capacitors C11 to C14 and the parallel capacitors C21 to C24 are metal-insulator-metal (MIM) capacitors. The parallel capacitors C21 to C24 are connected to the base 1 through via holes connecting front electrodes to rear electrodes.

First input pads PD11 to PD14 are connected to the inputs of the circuit patterns 11 to 14, respectively. A resistor R31 is connected between the first input pads PD11 and PD12. A resistor R32 is connected between the first input pads PD12 and PD13. A resistor R33 is connected between the first input pads PD13 and PD14. First microstrip lines L11 to L14 connect the outputs of the circuit patterns 11 to 14 to first output pads PD21 to PD24, respectively.

A field effect transistor is provided in the semiconductor substrate T1. The field effect transistor is divided into transistor cells Tr1 to Tr4. Each of the transistor cells Tr1 to Tr4 has fingers connected in parallel. The numbers of fingers of the transistor cells Tr1 to Tr4 are the same. Notably, the transistor cells Tr1 to Tr4 are source-grounded transistors respectively having source electrodes Si to S4 connected to the rear electrodes through via holes. Second input pads PD32 to PD34 are gate pads and connected to the gates of the transistor cells Tr1 to Tr4, respectively. Second output pads PD41 to PD44 are connected to the drains of the transistor cells Tr1 to Tr4, respectively.

The first wires W11 to W14 connect the input terminal IN to the first input pads PD11 to PD14, respectively. The second wires W21 to W24 connect the first output pads PD21 to PD24 to the second input pads PD31 to PD34, respectively. The third wires W31 to W34 connect the second output pads PD41 to PD44 to the output terminal OUT, respectively. The heights of two adjacent wires of the parallelly disposed bonding wires are the same.

First microstrip lines L11 and L14 are connected to the circuit patterns 11 and 14 disposed on both sides of the lining-up circuit patterns 11 to 14. First microstrip lines L11 and L14 are longer than the other first microstrip lines L12 and L13. The lengths and widths of the first microstrip lines L11 and L14 are so configured that impedances as seen from the transistor cells Tr1 to Tr4 are equivalent.

Figure 5:
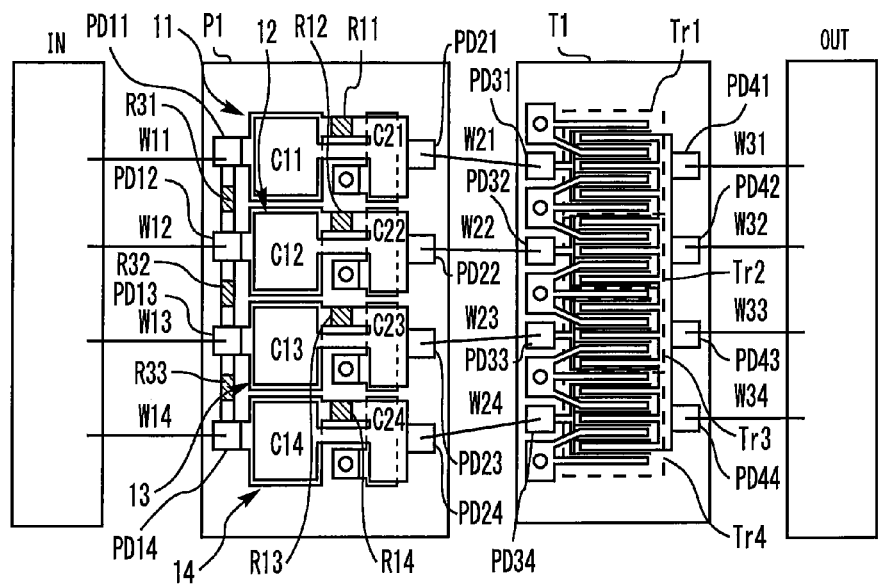
FIG. 5 is a plan view showing the inside of a semiconductor device according to the comparative example.
Figure 6:
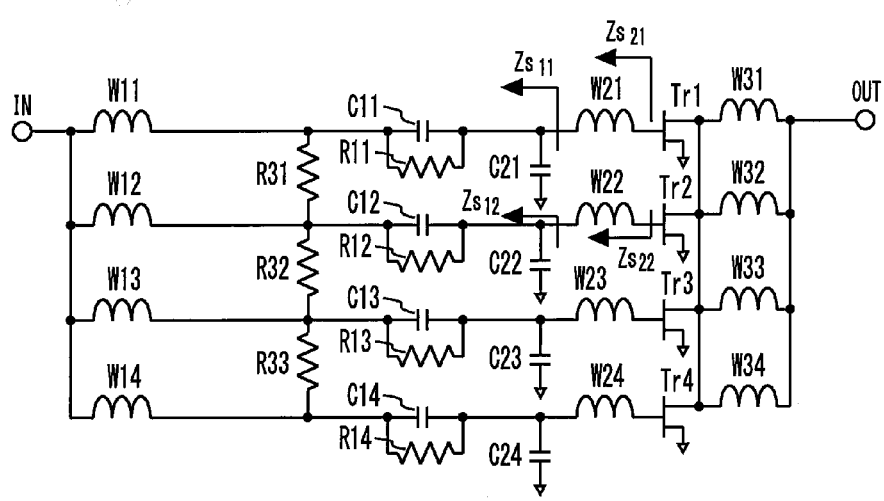
FIG. 6 is a diagram showing an equivalent circuit of the semiconductor device according to the comparative example.

Operation of the semiconductor device according to the present embodiment is described, compared with that of a comparative example. FIG. 5 is a plan view showing the inside of a semiconductor device according to the comparative example. FIG. 6 is a diagram showing an equivalent circuit of the semiconductor device according to the comparative example. In the comparative example, the heights of the wires W21 and W24 are larger than those of the wires W22 and W23, so that the sums of the self-inductances and the mutual inductances are even for all the wires. Omitted from the figure, the lengths of the first microstrip lines are the same.

Figure 7:
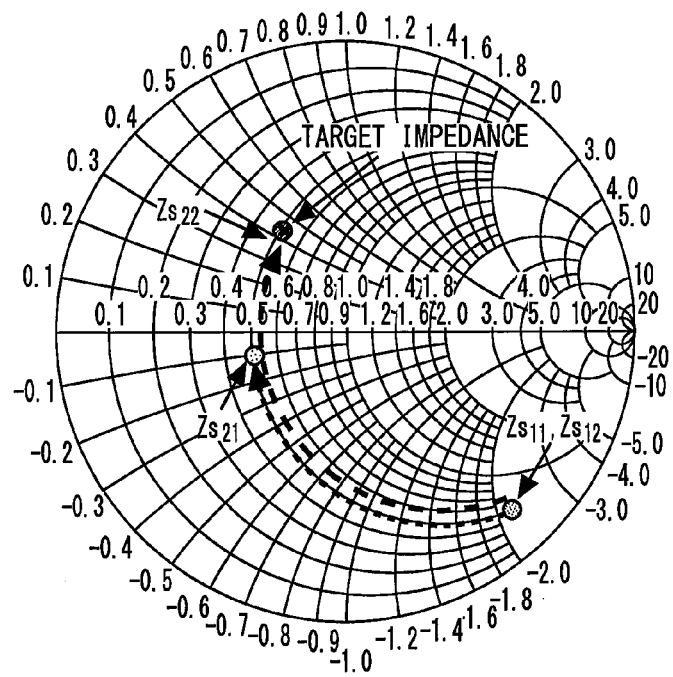
FIG. 7 is a diagram showing the results of calculation of impedances at nodes without any measures against the difference between mutual inductances.
Figure 8:
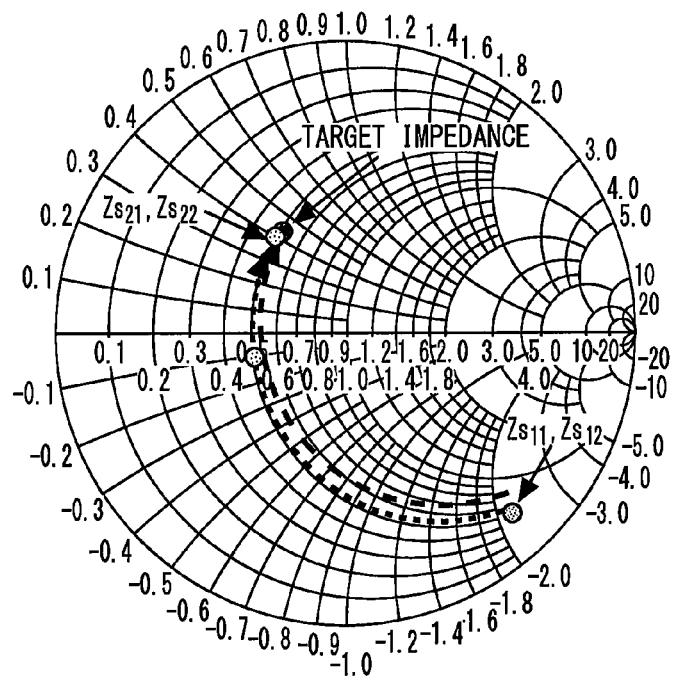
FIG. 8 is a diagram showing the results of calculation of impedances at nodes in the comparative example.
Figure 9:
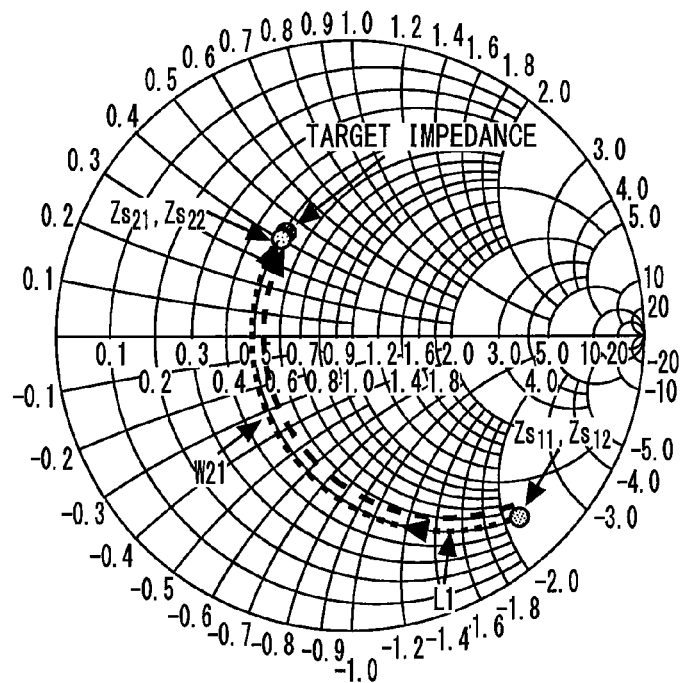
FIG. 9 is a diagram showing the results of calculation of impedances at nodes in the first embodiment.

FIG. 7 is a diagram showing the results of calculation of impedances at nodes without any measures against the difference between mutual inductances. FIG. 8 is a diagram showing the results of calculation of impedances at nodes in the comparative example. FIG. 9 is a diagram showing the results of calculation of impedances at nodes in the first embodiment. In the calculations, it is supposed that the inductances of the wires on both sides are smaller by 20% than the inductances of the inner wires due to the difference in mutual inductance, and that no unevenness in load impedance is for Zs11 to Zs14. The normalized impedance in the Smith charts shown in FIGS. 7 to 9 is 5Ω, and the signs x in the figures indicate the target impedance.

It is apparent from FIG. 7 that, without any measures, the load impedances Zs21 and Zs24 of the transistor cells on both sides are diverted from the target impedance due to the difference in wires' inductances, which causes unevenness in load impedances. It is understood from FIG. 8 that all the load impedances can be matched with adjustment of the lengths of the wires on both sides. It is found from FIG. 9 that, also in the present embodiment similarly to the conventional art, the load impedances can be made even with adjustment of the microstrip lines.

Figure 10:
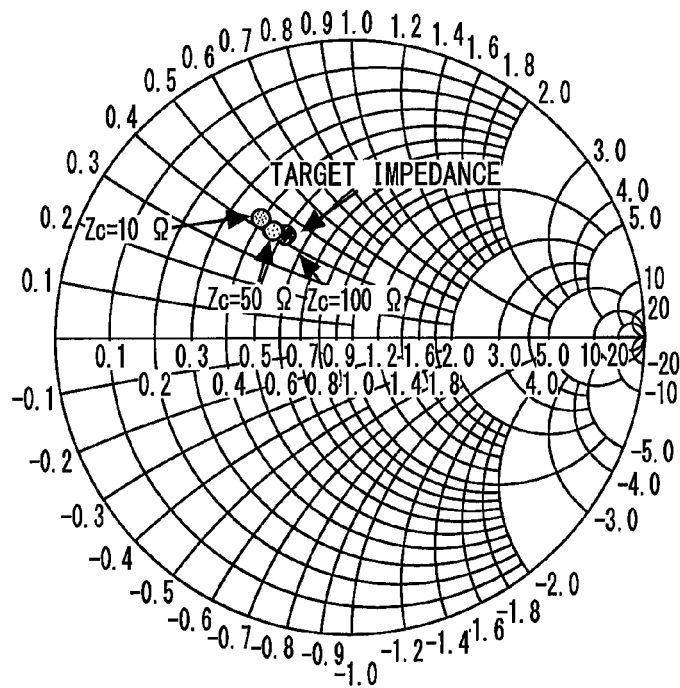
FIG. 10 is a diagram showing the results of calculating the load impedances over change in characteristic impedances of the microstrip lines of the circuit patterns on both sides according to the first embodiment of the present invention.

Subsequently, described is designing of the widths and lengths of the first microstrip lines L11 and L14. A series inductance component is predominant in a wire at low frequency as in the L-band and the S-band. The trace of the series inductance is plotted on an equi-resistance circle in a Smith chart. Meanwhile, the trace of the microstrip line is plotted on a circle around the characteristic impedance of the line. Strictly to say, hence, addition of the microstrip line cannot sufficiently supplement the shortage in inductance of the wire. Nevertheless, when the characteristic impedance of the microstrip line is sufficiently high, the difference can almost be ignored. FIG. 10 is a diagram showing the results of calculating the load impedances over change in characteristic impedances of the microstrip lines of the circuit patterns on both sides according to the first embodiment of the present invention. The lengths of the microstrip lines have been adjusted. When the characteristic impedance is 50Ω or 100Ω, the target impedance can almost be attained. In the case of 10Ω, there is a significant difference from the target impedance. Accordingly, the characteristic impedance of the microstrip line has to be 50Ω or more in order to secure the load impedances to be sufficiently even. On the other hand, when the characteristic impedance of the line exceeds 200Ω, the sensitivity of the load impedance with respect to the length of the line is too high. Therefore, it is desirable that the characteristic impedances of the first microstrip lines L11 and L14 be 50Ω to 200Ω.

As described above, in the present embodiment, the first microstrip lines L11 and L14 connected to the circuit patterns 11 and 14 disposed on both sides of the lining-up circuit patterns 11 to 14 are longer than the other first microstrip lines L12 and L13. The inductances of the microstrip lines are thereby added for the wires small in mutual inductance, and the sums of the inductances are made equal, which make the impedances as seen from the transistor cells Tr1 to Tr4 even. Thereby, the load impedances of the transistor cells can be made even without change in shapes of the bonding wires, which can improve the saturated power, the efficiency and the gain. Moreover, oscillation caused by unevenness in load impedances can be suppressed. Namely, deterioration in characteristics and oscillation due to uneven operations of the transistor cells can be suppressed. Furthermore, the bonding wires are not needed to be made long or high, which can suppress deviation of the bonding wires and reduce production costs. Furthermore, since the widths and lengths of the microstrip lines can be freely designed, optimized designing can be facilitated. Further, the first microstrip lines L11 and L14 can be bent as shown in FIG. 3, which prevents a large substrate size.

The lengths of the first microstrip lines L11 to L14 may be so configured to be longer as coming closer to both sides of circuit patterns 11 to 14. Therefore, unevenness in load impedances can be further improved as compared with only the microstrip lines on both sides being long.

Second Embodiment

Figure 11:
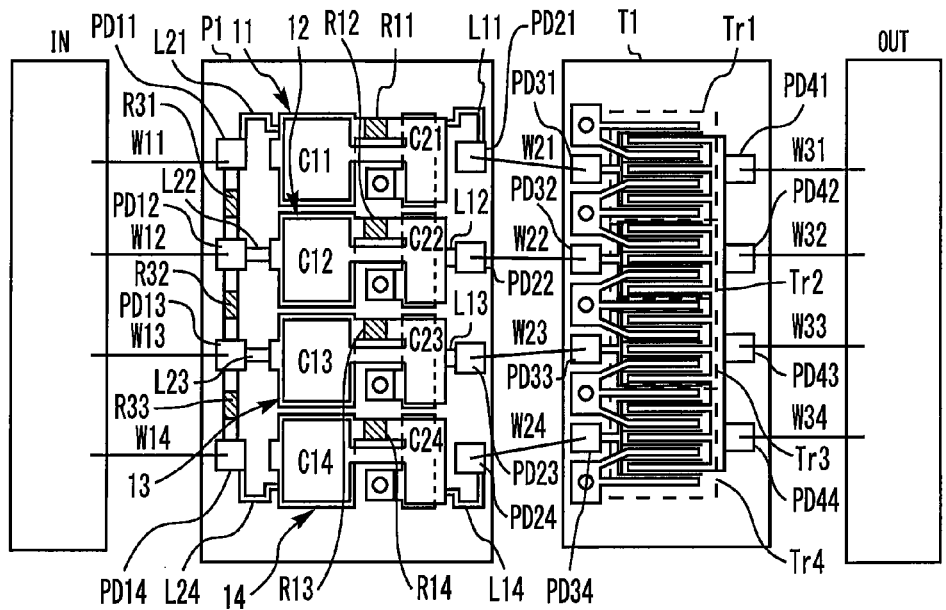
FIG. 11 is a plan view showing a semiconductor device according to a second embodiment of the present invention.

FIG. 11 is a plan view showing a semiconductor device according to a second embodiment of the present invention. The circuit substrate P1 has second microstrip lines L21 to L24 connecting the inputs of the circuit patterns 11 to 14 to the first input pads PD11 to PD14, respectively. Second microstrip lines L21 and L24 are longer than the other second microstrip lines L22 and L23, the second microstrip lines L21 and L24 connected to the circuit patterns 11 and 14 disposed on both sides of the lining-up circuit patterns 11 to 14. This can supplement the smaller mutual inductances of the wires W11 and W14, which can further enhance evenness in load impedances than in the first embodiment. The other effects are the same as those of the first embodiment. The lengths of the second microstrip lines L21 to L24 may be so configured to be longer as coming closer to both sides of the circuit patterns 11 to 14.

Third Embodiment

Figure 12:
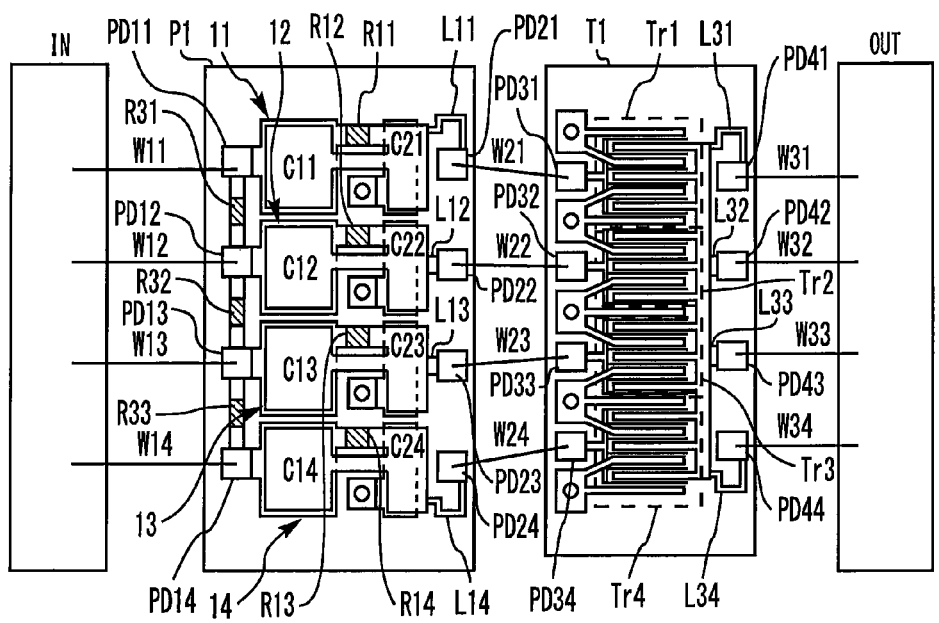
FIG. 12 is a plan view showing a semiconductor device according to a third embodiment of the present invention.

FIG. 12 is a plan view showing a semiconductor device according to a third embodiment of the present invention. In addition to the configuration in the second embodiment, the semiconductor substrate T1 has third microstrip lines L31 to L34 connecting the outputs of the transistor cells Tr1 to Tr4 to the second output pads PD41 to PD44, respectively. Third microstrip lines L31 and L34 are longer than the other third microstrip lines L32 and L33, the third microstrip lines L31 and L34 connected to the transistor cells Tr1 and Tr4 disposed on both sides of the lining-up transistor cells Tr1 to Tr4. This can supplement the smaller mutual inductances of the wires W31 and W34, which can enhance evenness in output load impedances. The other effects are the same as those of the first and second embodiments. The lengths of the third microstrip lines L31 to L34 may be so configured to be longer as coming closer to both sides of the transistor cells Tr1 to Tr4.

Fourth Embodiment

Figure 13:
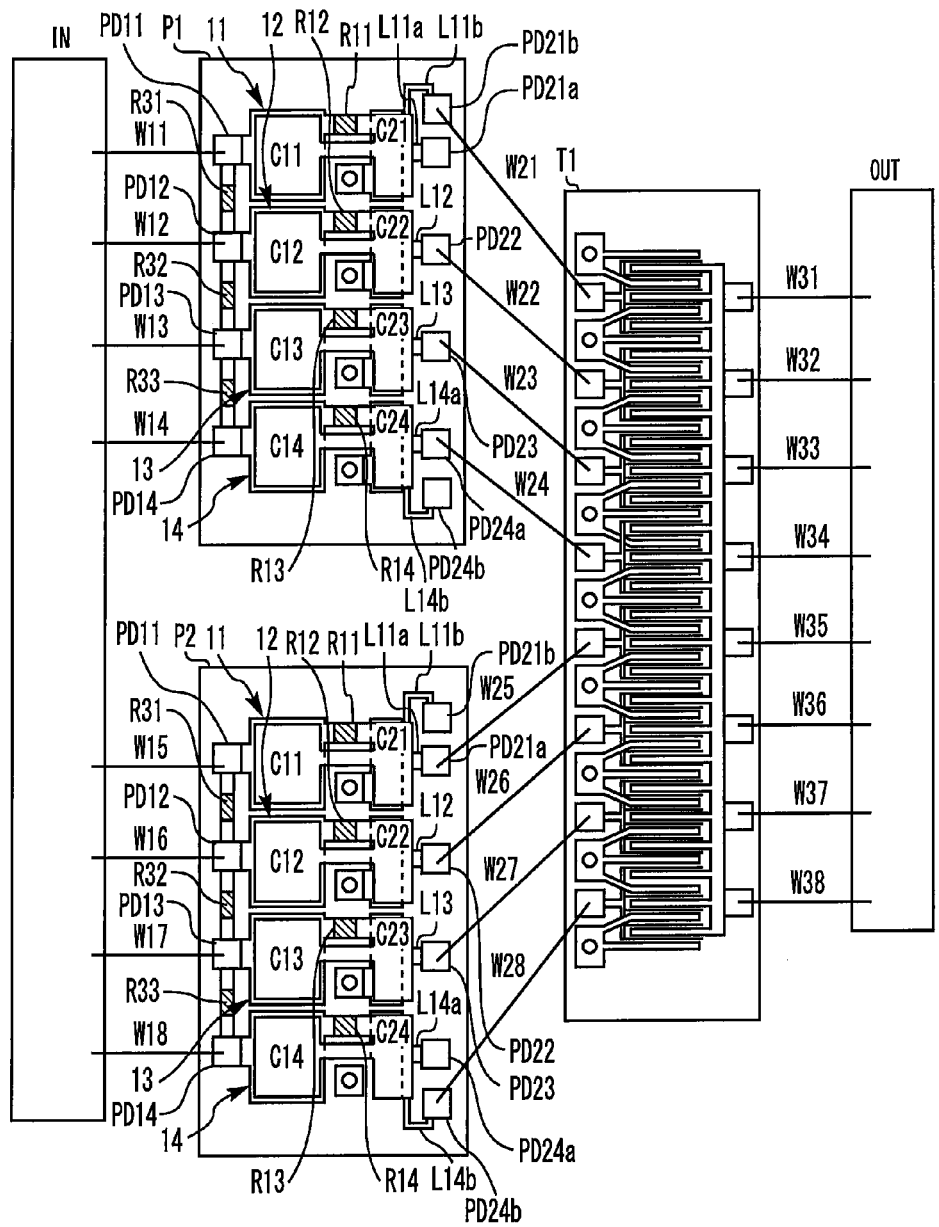
FIG. 13 is a plan view showing a semiconductor device according to a fourth embodiment of the present invention.

FIG. 13 is a plan view showing a semiconductor device according to a fourth embodiment of the present invention. In the present embodiment, two circuit substrates P1 and P2 constituting an input matching circuit are disposed side by side. The layouts in the circuit substrates P1 and P2 are the same. In each of the circuit substrates P1 and P2, first pads PD21a and PD24a are connected to the circuit patterns 11 and 14 on both sides via fourth microstrip lines L11a and L14a, respectively. Second pads PD21b and PD24b are connected to the circuit patterns 11 and 14 via fifth microstrip lines L11b and L14b, respectively, which are longer than the fourth microstrip lines L11a and L14a. The fourth microstrip lines L11a and L14a are designed similarly to the first microstrip lines L12 and L13. The fifth microstrip lines L11b and L14b are designed similarly to the first microstrip lines L11 and L14 in the first embodiment.

In the adjacent circuit patterns disposed on inside edges oft the circuit substrates P1 and P2, the second wires are connected to the first pads PD2 that are connected to the shorter microstrip lines. In the circuit patterns disposed on outside edges of the circuit substrates P1 and P2, the second wires are connected to the second pads PD2 that are connected to the longer microstrip lines.

In general, when circuit substrates are implemented in a package, a long and thin circuit substrate tends to cause cracking of itself. To deal with this, there can be a method of dividing the circuit substrate into two substrates. Also in this case, according to this fourth embodiment, two circuit substrates of the same kind can be disposed side by side to reduce the probability of cracking, and the effects similar to those of the first embodiment can be attained. Furthermore, when two semiconductor devices are developed which are constituted of different numbers of transistor cells, they can share the circuit substrates constituting their input matching circuits. For example, a four-cell article whose output power is 100 W may employ the configuration of the first embodiment, and an eight-cell article whose output power is 200 W may employ the configuration of this fourth embodiment. Thereby, the two articles can share the circuit substrate to be used, which can attain low costs. Moreover, the second and third embodiments may be employed for their variations.

Fifth Embodiment

Figure 14:
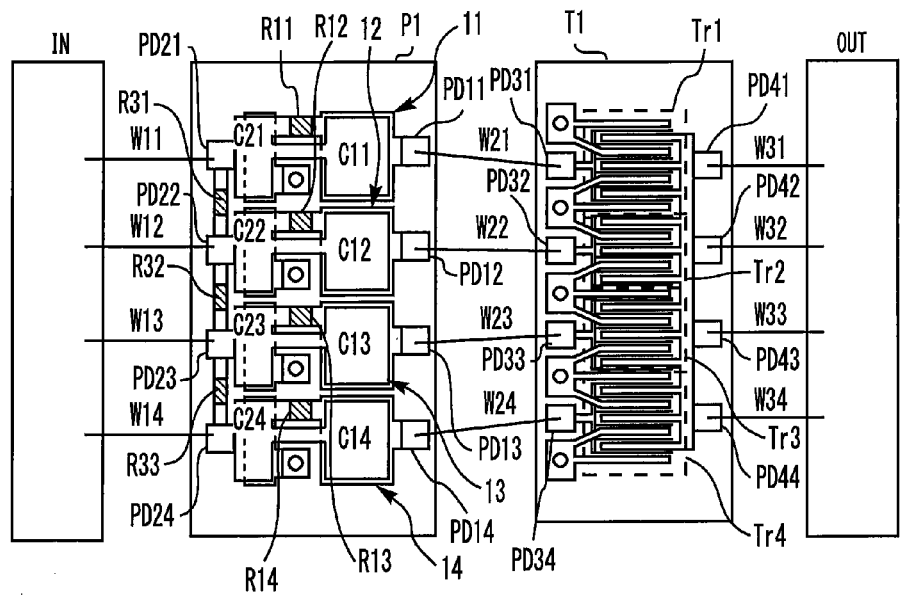
FIG. 14 is a plan view showing a semiconductor device according to a fifth embodiment of the present invention.
Figure 15:
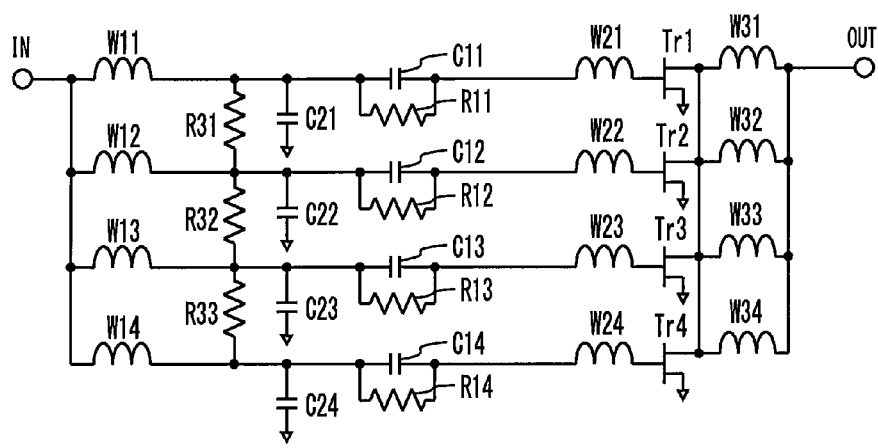
FIG. 15 is a circuit diagram showing the semiconductor device according to the fifth embodiment of the present invention.

FIG. 14 is a plan view showing a semiconductor device according to a fifth embodiment of the present invention. FIG. 15 is a circuit diagram showing the semiconductor device according to the fifth embodiment of the present invention. In the present embodiment, differently from the first embodiment, the series capacitors C11 to C14 are connected between the parallel capacitors C21 to C24 and the first output pads PD21 to PD24, respectively. There are no microstrip lines for mutual inductance correction, but instead, the capacitances of the series capacitors C11 to C14 are adjusted. The trace of the series inductance is plotted on an equi-resistance circle in a Smith chart as mentioned above. Likewise, the trace of the series capacitor is plotted also on an equi-resistance circle therein. Adjustment of the capacitances of the series capacitors can also make the load impedances even in a specific frequency band.

The frequency characteristics on the equi-resistance circle are reverse to each other for the series capacitor and the series inductance. Therefore, the capacitances of the series capacitors C11 and C14 are so configured to be larger than the capacitances of the other series capacitors C12 and C13, the series capacitors C11 and C14 being of the circuit patterns 11 and 14 on both sides, of the lining-up circuit patterns 11 to 14, that are smaller in inductance. Thereby, the load impedances of the transistor cells can be made even at the fundamental wave frequency without change in shapes of the bonding wires. Accordingly, deterioration in characteristics and oscillation due to uneven operations of the transistor cells can be suppressed. Moreover, the saturated power, the efficiency and the gain can be improved. Furthermore, the bonding wires are not needed to be made long, which can suppress deviation of the bonding wires and reduce production costs. Furthermore, since the capacitances of the series capacitors can be freely designed, optimized designing can be facilitated.

It should be noted that the series capacitors C11 to C14 have to form cascade connections to the second wires W21 to W24, respectively, in order to attain the aforementioned effects. When the parallel capacitors C21 to C24 are connected therebetween, the trace of the impedance varies, which disables the load impedances to be made even.

The capacitances of the series capacitors C11 to C14 of the circuit patterns 11 to 14 may be so configured to be larger as coming closer to both sides of the circuit patterns. Unevenness in load impedances can be further improved as compared with the capacitances of only the series capacitors on both sides being adjusted.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-188202, filed on Sep. 27, 2016 including specification, claims, drawings and summary, on which the Convention priority of the present application is based, is incorporated herein by reference in its entirety.

The invention claimed is:

1. A semiconductor device comprising:
an input terminal;
a circuit substrate including a plurality of circuit patterns containing a parallel capacitor, a plurality of first input pads connected to inputs of the circuit patterns respectively; a plurality of first output pads, and a plurality of first microstrip lines connecting outputs of the circuit patterns to the first output pads respectively;
a semiconductor substrate including a plurality of transistor cells, a plurality of second input pads connected to inputs of the transistor cells, and a plurality of second output pads connected to outputs of the transistor cells;
an output terminal;
a plurality of first wires connecting the input terminal to the first input pads respectively;
a plurality of second wires connecting the first output pads to the second input pads respectively; and
a plurality of third wires connecting the second output pads to the output terminal respectively,
wherein each of the transistor cells has a plurality of fingers connected in parallel and a source electrode connected to a rear electrode through a via hole,
the numbers of the fingers of the transistor cells are the same, and
the first microstrip lines connected to the circuit patterns disposed on both sides of the lining-up circuit patterns are longer than the other first microstrip lines.

2. The semiconductor device according to claim 1, wherein the circuit substrate includes a plurality of second microstrip lines connecting inputs of the circuit patterns to the first input pads respectively, and
the second microstrip lines connected to the circuit patterns disposed on both sides of the lining-up circuit patterns are longer than the other second microstrip lines.

3. The semiconductor device according to claim 1, wherein the semiconductor substrate includes a plurality of third microstrip lines connecting outputs of the transistor cells to the second output pads respectively, and
the third microstrip lines connected to the transistor cells disposed on both sides of the lining-up transistor cells are longer than the other third microstrip lines.

4. The semiconductor device according to claim 1, wherein the circuit substrate includes first and second substrates disposed side by side,
in each of the first and second substrates, first pads are connected to the circuit patterns on both sides via fourth microstrip lines and second pads are connected to the circuit patterns on both sides via fifth microstrip lines which are longer than the fourth microstrip lines,
in the adjacent circuit patterns disposed on inside edges of the first and second substrates, the second wires are connected to the first pads, and
in the circuit patterns disposed on outside edges of the first and second substrates, the second wires are connected to the second pads.

5. The semiconductor device according to claim 1, wherein lengths of the first microstrip lines are longer as coming closer to both sides of circuit patterns.

6. The semiconductor device according to claim 1, wherein characteristic impedances of the first microstrip lines connected to the circuit patterns disposed on both sides of the lining-up circuit patterns are 50Ω to 200 Ω.

7. A semiconductor device comprising:
an input terminal;
a circuit substrate including a plurality of circuit patterns, a plurality of first input pads connected to inputs of the circuit patterns respectively, and a plurality of first output pads connected to outputs of the circuit patterns respectively;
a semiconductor substrate including a plurality of transistor cells, a plurality of second input pads connected to inputs of the transistor cells, and a plurality of second output pads connected to outputs of the transistor cells;
an output terminal;
a plurality of first wires connecting the input terminal to the first input pads respectively;
a plurality of second wires connecting the first output pads to the second input pads respectively; and
a plurality of third wires connecting the second output pads to the output terminal respectively,
wherein each of the transistor cells has a plurality of fingers connected in parallel and a source electrode connected to a rear electrode through a via hole,
the numbers of the fingers of the transistor cells are the same,
each of the circuit patterns has a parallel capacitor, a series capacitor connected between the parallel capacitor and the first output pad, and a resistor connected to the series capacitor in parallel, and
capacitances of the series capacitors of the circuit patterns disposed on both sides of the lining-up circuit patterns are larger than capacitances of the other series capacitors.

8. The semiconductor device according to claim 7, wherein capacitances of the series capacitors of the circuit patterns are larger as coming closer to both sides of the circuit patterns.

* * * * *